United States Patent [19]
Cho et al.

[11] Patent Number: 5,215,546
[45] Date of Patent: Jun. 1, 1993

[54] METHOD AND APPARATUS FOR SAW DEVICE PASSIVATION

[75] Inventors: Fred Y. Cho, Scottsdale; David Penunuri, Fountain Hills; Robert F. Falkner, Jr., Paradise Valley, all of Ariz.

[73] Assignee: Motorola, Inc., Schaumburg, Ill.

[21] Appl. No.: 759,193

[22] Filed: Sep. 10, 1991

Related U.S. Application Data

[63] Continuation of Ser. No. 577,181, Sep. 4, 1990, abandoned.

[51] Int. Cl.$^5$ ............................................. H01L 41/08
[52] U.S. Cl. .............................. 29/25.01; 310/313 R; 310/313 B
[58] Field of Search ................ 29/25.01; 310/313 R, 310/313 B

[56] References Cited

U.S. PATENT DOCUMENTS

| | | | |
|---|---|---|---|
| 4,270,105 | 5/1981 | Parker et al. | 310/313 A |
| 4,354,130 | 10/1982 | Ono et al. | 310/313 A |
| 4,401,956 | 8/1983 | Joshi | 310/313 D |
| 4,516,049 | 5/1985 | Mikoshiba et al. | 310/313 A |
| 4,567,393 | 1/1986 | Asai et al. | 310/313 A |
| 4,617,487 | 10/1986 | Sone et al. | 310/313 B |
| 4,952,832 | 8/1990 | Imai et al. | 310/313 R |

FOREIGN PATENT DOCUMENTS

| | | | |
|---|---|---|---|
| 0219706 | 9/1987 | Japan | 310/313 R |

*Primary Examiner*—Olik Chaudhuri
*Assistant Examiner*—Ken Horton
*Attorney, Agent, or Firm*—Frederick M. Fliegel

[57] ABSTRACT

A passivation layer of dielectric material disposed on the top surface of the SAW device prevents the metallized transducer pattern on the piezoelectric substrate from being exposed to chemical attack. This layer also provides for improved metal acousto-migration resistance through the well-known mechanism of grain boundary pinning. The piezoelectric SAW device substrate includes a dielectric layer which is disposed along the surface over the transducer metallization. The piezoelectric substrate includes metallized regions on top of the dielectric layer which is disposed over the substrate surface and the SAW transducers thereon. These metallized regions form capacitors to the transducer busses and capacitively couple electrical input and output signals to the transducers from external electronic apparatus.

20 Claims, 1 Drawing Sheet

5,215,546

METHOD AND APPARATUS FOR SAW DEVICE PASSIVATION

This application is a continuation of prior U.S. patent application Ser. No. 577,181, filed Sept. 4, 1990, now abandoned.

BACKGROUND OF THE INVENTION

This invention pertains to surface acoustic wave (SAW) devices and more particularly to an arrangement for improving SAW device corrosion resistance and reliability.

A surface acoustic wave device includes a piezoelectric substrate which has a highly polished surface and metallized SAW transducer patterns on that surface. The transducers are disposed on the polished surface of the piezoelectric substrate such that they are acoustically coupled to one another. The transducer patterns consist of metal strips which couple electrical signals to acoustic signals through the piezoelectric effect, and summing busses which connect the strips to form a filter function and which act as the external electrical connections to the strips. The metal strips of the SAW device, if exposed to the environment directly, can become contaminated and corrode. Passivation of the SAW devices including metal strips has been attempted, but making an electrical connection to these metal strips is a problem since a hole, or via, must be cut through the passivation layer to make electrical connection to the metal strips. Holes in the passivation material allow the environment to attack and contaminate the metal strips. Prior art passivation techniques have relied on holes etched through the passivating layer in order to establish DC connection to the underlying circuitry. Contaminants can adversely affect the performance of these SAW devices by absorbing acoustic energy or by reacting chemically with the transducer metallization.

Therefore, it is an object of the present invention to provide an SAW device which is passivated against chemical attack and having less stringent manufacturing and packaging requirements.

SUMMARY OF THE INVENTION

In accomplishing the object of the present invention, a novel SAW device passivation technique which utilizes capacitive coupling of the input and output signals through the passivation layer is shown.

The passivation apparatus for coupling to a surface acoustic wave device includes a substrate which has an electrode structure. Also included is a SAW transducer. The SAW transducer is coupled to the substrate for producing surface acoustic waves.

The apparatus further includes a passivation layer which covers the substrate including the electrode structure and the SAW transducer for a predetermined thickness. Lastly, an AC coupling is provided. The AC coupling is disposed on the passivation layer and over the electrode structure. This provides for AC coupling of signals to the electrode structure of the SAW substrate.

The above and other objects, features, and advantages of the present invention will be better understood from the following detailed description taken in conjunction with the accompanying drawings.

DESCRIPTION OF THE PREFERRED EMBODIMENT

Figure 1:
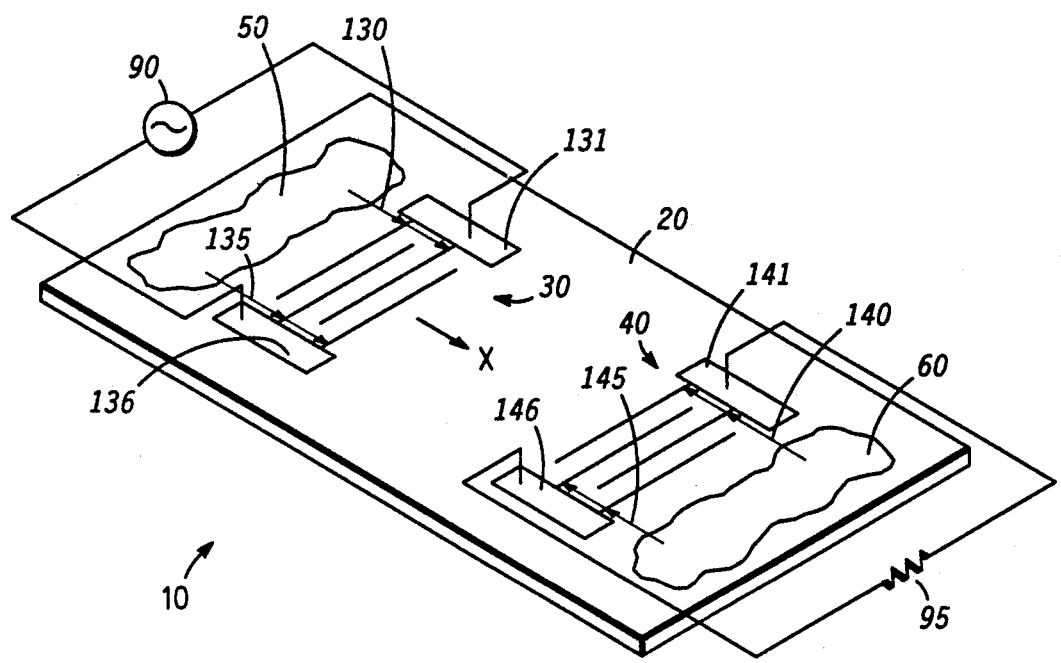
FIG. 1 is a plan view of a surface acoustic wave device.

Referring to FIG. 1, a top view of a SAW device 10 which includes a piezoelectric substrate 20 and having interdigitated transducers 30 and 40 formed thereon is shown. Although two SAW transducers are shown, the present invention is not limited to configurations of only two SAW transducers. Piezoelectric substrate 20 may be implemented on a substrate such as one made of a piezoelectric semiconductor material. The piezoelectric substrate may comprise lithium niobate, lithium tantalate, or quartz. The piezoelectric semiconductor substrate may comprise materials such as zinc oxide or aluminum nitride, as well as other suitable materials. The transducer 30 is composed of interdigitated combs of electrodes 130 and 135 together with bus bars 131 and 136 which serve to interconnect the electrode combs 130 and 135, respectively. The transducer 40 is composed of interdigitated combs of electrodes 140 and 145 and bus bars 141 and 146, which serve to interconnect the electrode combs 140 and 145, respectively. The electrodes 130, 135, 140, and 145, and the bus bars 131, 136, 141, and 146 may be formed of any suitable metal such as aluminum.

In normal use the transducer 30 will emit acoustic waves along the surface of the substrate 20 in direction X in response to electrical stimulation by an external voltage source 90 electrically coupled to bus bars 131 and 136. The substrate 20 acoustically couples the two transducers 30 and 40. The transducer 40 will emit an electrical signal from bus bars 141 and 146 in response to the acoustic wave launched from transducer 30, and couple this electrical signal to an external load 95.

The acoustic absorbers 50 and 60 are composed of a viscous material such as a room temperature vulcanizing silicone rubber and are placed to avoid unwanted reflections of acoustic signals from the edges of substrate 20, which, if not suppressed, would give rise to unwanted, spurious output signals. The interconnections to the external load 95 and source 90 are typically by means of wires, such as wire 150 of FIG. 2, bonded to the bus bars 131, 136, 141, and 146, but may be effected through other interconnection means as well.

Figure 2:
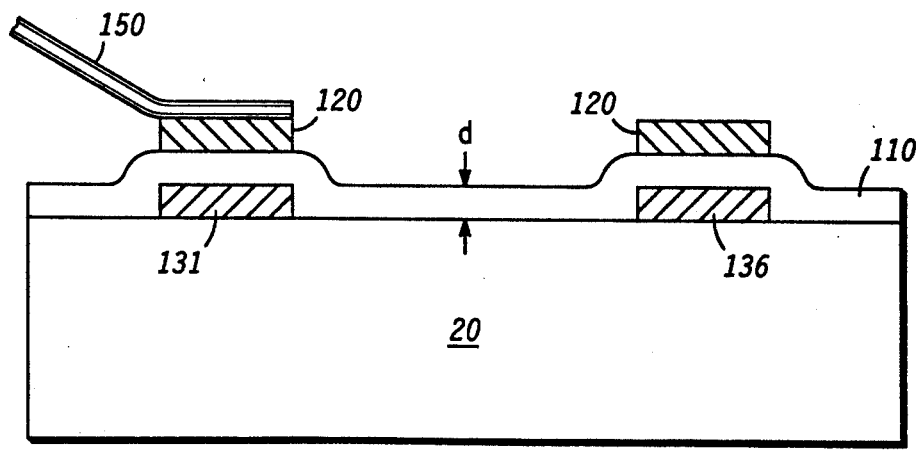
FIG. 2 is a drawing of a cross section through a passivated SAW device.

FIG. 2 is a cross-sectional view of a SAW device such as 30 or 40 of FIG. 1 employing a dielectric passivation layer 110 disposed on the surfaces of substrate 20 and the SAW transducers 30 and 40. Dielectric passivation layer 110 may include a layer of hydrogenated silicon nitride. The hydrogenated silicon nitride layer may be deposited by plasma-enhanced chemical vapor deposition. SAW device 10 also includes upper metallized capacitor electrodes 120 which capacitively couple to the SAW transducer bus bars 131, 136, 141, and/or 146. External connections to other electronic circuitry are made via AC coupling to the upper capacitor electrodes 120 by either conventional wirebonding techniques, such as 150 shown, for example, or by other means.

The dielectric layer 110 thus completely covers all of the metallization of SAW transducers 30 and 40, in contrast to prior art. SAW devices operate at RF signals up to several gigahertz in frequency. Signals can be coupled in and out of the SAW transducers through the dielectric passivation layer 110 as shown in FIG. 2. The coupling capacitance, $C_c$, is approximated by:

$$C_c = \epsilon_r \epsilon_0 A/d$$

where $\epsilon_r$ is the relative dielectric constant of the passivation layer, $\epsilon_0$ is the permittivity of free space, A is the parallel plate area between the wire bond pad and the coupling pad, and d is the thickness of the passivation layer as shown in FIG. 2. The absence of etched vias in this approach ensures complete protection of SAW transducer metallization from chemical attack, scratching due to handling of the devices during fabrication, and contamination. Further, the capacitive coupling technique allows elimination of contact between the metals employed for SAW transducers and for external connections, which metals are often dissimilar. Contact between dissimilar metals is often the cause of metallurgical failure of such interconnects. The above described AC coupling by passivation may also be applied to semiconductor devices.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. Apparatus for passivation of a Surface Acoustic Wave (SAW) device comprising:
   substrate means;
   SAW transducer means coupled to said substrate means for producing surface acoustic waves, said SAW transducer means including electrode means;
   said electrode means including first and second bus bar means and at last one electrode, said at least one electrode coupled to said first bus bar means;
   passivation means covering said SAW transducer means and said substrate means to a particular thickness;
   first AC coupling means disposed on said passivation means and aligned substantially directly above said first bus bar means and not above said second bus bar means to provide for capacitive coupling of electrical signals to said first bus bar means; and
   second AC coupling means disposed on said passivation means and aligned substantially directly above said second bus bar means and not above aid first bus bar means to provide for capacitive coupling of electrical signals to said second bus bar means.

2. Apparatus for passivation of a SAW device as claimed in claim 1, wherein said passivation means includes dielectric layer means.

3. Apparatus for passivation of a SAW device as claimed in claim 1, wherein said substrate means includes piezoelectric means.

4. Apparatus for passivation of a SAW device as claimed in claim 1, wherein said electrode means includes metallized electrodes.

5. Apparatus for passivation of a SAW device as claimed in claim 1, wherein said second AC coupling means includes second electrode means.

6. Apparatus for passivation of a SAW device as claimed in claim 5, wherein said second electrode means includes metallized electrodes.

7. Apparatus for passivation of a SAW device as claimed in claim 5, wherein said second AC coupling means further includes wirebonding means coupled to said second electrode means, said wirebonding means for applying electrical signals to said SAW device.

8. Apparatus for passivation of a SAW device as claimed in claim 2, wherein said dielectric layer means includes a layer of hydrogenated silicon nitride.

9. A method for passivation of a Surface Acoustic Wave (SAW) device comprising the steps of:
   providing a piezoelectric substrate;
   coupling a SAW transducer, including first and second bus bars and first electrodes connected to the bus bars, to the substrate;
   depositing a passivation layer covering the substrate and SAW transducer for a particular thickness;
   providing a second electrode positioned on the passivation layer and aligned substantially directly above the first bus bar and not above the second bus bar;
   providing a third electrode positioned on the passivation layer and aligned substantially directly above the second bus bar and not above the first bus bar; and
   AC coupling electrical signals via the second electrodes to the first bus bar and via the third electrode to the second bus bar.

10. A method for passivation of a SAW device as claimed in claim 9, wherein said step of AC coupling includes the step of producing surface acoustic waves by the SAW transducer in response to the coupled electrical signal to the first and second bus bars.

11. A method for passivation of a SAW device as claimed in claim 9, wherein said step of depositing a passivation layer includes the step of covering the substrate and the SAW transducer with a dielectric layer.

12. A method for passivation of a SAW device as claimed in claim 11, wherein there is further included the step of forming a capacitive coupling from the first to the second electrode via the dielectric layer.

13. A method for passivation of a SAW device as claimed in claim 11, wherein the step of covering the substrate and the SAW transducer includes the step of plasma-enhanced chemical vapor depositing a layer of hydrogenated silicon nitride.

14. Apparatus for passivation of a Surface Acoustic Wave (SAW) device comprising:
   substrate means;
   SAW transducer means coupled to said substrate means for producing surface acoustic waves, said SAW transducer means including electrode means;
   passivation means covering said SAW transducer means and said substrate means to a particular thickness, wherein said particular thickness, d, of said passivation covering may be approximated by:

$$d = \epsilon_r \epsilon_0 A / C_c$$

where $\epsilon_r$ is the relative dielectric constant of the passivation layer, $\epsilon_0$ is the permittivity of free space, A is the parallel plate area between a wire bond pad and a coupling pad, and $C_c$ is the coupling capacitance; and
   AC coupling means comprising said wire bond pad disposed on said passivation means and disposed over said electrode means of said SAW transducer means to provide for coupling of signals to said electrode means.

15. A method for passivation of a Surface Acoustic Wave (SAW) device comprising the steps of:
providing a piezoelectric substrate including first electrodes;
coupling a SAW transducer to the substrate;
depositing a passivation layer covering the substrate and SAW transducer for a particular thickness, d, approximated by:

$$d = \epsilon_r \epsilon_o A / C_c$$

where $\epsilon_r$ is the relative dielectric constant of the passivation layer, $\epsilon_o$ is the permittivity of free space, A is the parallel plate area between a wire bond pad and a coupling pad, and $C_c$ is the coupling capacitance;
providing second electrodes comprising wire bond pads positioned on the passivation layer and over the first electrodes; and
AC coupling electrical signals via the second electrode to the first electrode.

16. Apparatus for passivation of a SAW device as claimed in claim 14, wherein said dielectric layer means includes a layer of hydrogenated silicon nitride.

17. A method for passivation of a SAW device as claimed in claim 15, wherein the step of covering the substrate and the SAW transducer includes the step of plasma-enhanced chemical vapor depositing a layer of hydrogenated silicon nitride.

18. A method for passivation of a SAW device as claimed in claim 15, wherein step of depositing a passivation layer includes the step of covering the substrate and the SAW transducer with a dielectric layer.

19. Apparatus for passivation of a SAW device as claimed in claim 14, wherein said passivation means includes dielectric layer means.

20. Apparatus for passivation of a SAW device as claimed in claim 14, wherein said AC coupling means further includes wirebonding means coupled to said wire bond pad, said wirebonding means for applying electrical signals to said SAW device.

* * * * *